US008390296B2

United States Patent
Jung et al.

(10) Patent No.: US 8,390,296 B2
(45) Date of Patent: Mar. 5, 2013

(54) METHOD AND APPARATUS FOR DETECTING ABNORMALITY OF CURRENT SENSOR IN BATTERY PACK

(75) Inventors: Chang-Gi Jung, Daejeon (KR);
Ju-Young Kim, Daejeon (KR);
Jung-Soo Kang, Daejeon (KR);
Do-Youn Kim, Daejeon (KR);
Cheol-Taek Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 233 days.

(21) Appl. No.: 12/911,880

(22) Filed: Oct. 26, 2010

(65) Prior Publication Data

US 2011/0037476 A1    Feb. 17, 2011

Related U.S. Application Data

(63) Continuation of application No. PCT/KR2010/001336, filed on Mar. 3, 2010.

(30) Foreign Application Priority Data

Mar. 3, 2009   (KR) .................. 10-2009-0017968

(51) Int. Cl.
*G01N 27/416* (2006.01)
(52) U.S. Cl. ........ 324/433; 324/435; 324/606; 702/116; 702/117; 320/136
(58) Field of Classification Search .................. 702/116; 324/435
See application file for complete search history.

(56) References Cited

U.S. PATENT DOCUMENTS

| | | | | |
|---|---|---|---|---|
| 6,172,482 B1 * | 1/2001 | Eguchi | ........................ | 320/134 |
| 6,437,540 B2 * | 8/2002 | Sonobe | ........................ | 320/134 |
| 7,005,859 B2 * | 2/2006 | Knecht | ........................ | 324/522 |
| 7,432,719 B2 * | 10/2008 | Nozaki | ........................ | 324/522 |
| 7,570,025 B2 * | 8/2009 | Kim | .............................. | 320/150 |
| 7,994,798 B2 * | 8/2011 | Williams et al. | ............... | 324/537 |
| 8,148,993 B2 * | 4/2012 | Yamabe et al. | ............... | 324/433 |
| 2006/0139007 A1 | 6/2006 | Kim | | |
| 2008/0048619 A1 * | 2/2008 | Yoshida | ........................ | 320/134 |

FOREIGN PATENT DOCUMENTS

| | | | |
|---|---|---|---|
| JP | 7-282858 A | | 10/1995 |
| JP | 10-253682 | * | 9/1998 |
| KR | 20-0213647 Y1 | | 12/2000 |
| KR | 2003-0030129 A | | 4/2003 |
| KR | 10-2005-0046838 A | | 5/2005 |
| KR | 10-2008-0047004 A | | 5/2005 |
| KR | 10-2005-0114483 A | | 12/2005 |
| KR | 10-2006-0059682 A | | 6/2006 |

OTHER PUBLICATIONS

International Search Report, dated Sep. 29, 2010, issued in corresponding International Application PCT/KR2010/001336.

* cited by examiner

*Primary Examiner* — Richard Isla Rodas
(74) *Attorney, Agent, or Firm* — Birch, Stewart, Kolasch & Birch, LLP

(57) ABSTRACT

Disclosed are a method and an apparatus for detecting abnormality of a current sensor operative to measure a charge or discharge current of a battery pack. The method comprises measuring current and voltage of the battery pack; and detecting abnormality of the current sensor by comparing variations in current and voltage over a predetermined time with a current reference value and a voltage reference value, respectively.

According to the present invention, it is capable of improving reliability of the battery pack, and in case that the current sensor is out of order, of protecting the battery pack from dangerous accidents such as explosion.

3 Claims, 3 Drawing Sheets

METHOD AND APPARATUS FOR DETECTING ABNORMALITY OF CURRENT SENSOR IN BATTERY PACK

CROSS-REFERENCE TO RELATED APPLICATION

This application is a continuation of International Application No. PCT/KR2010/001336 filed on Mar. 3, 2010, which claims priority to Korean Patent Application No. 10-2009-0017968 in Republic of Korea on Mar. 3, 2009, the entire contents of which are incorporated herein by reference.

BACKGROUND OF THE INVENTION

1. Field of the Invention

The present invention relates to a method for detecting abnormality of a current sensor in a battery pack, and more particularly, to a method and an apparatus for detecting abnormality of a current sensor in a battery pack by measuring voltage and current flowing in the battery pack.

2. Description of the Related Art

As the demands for portable electronic products such as notebooks, video cameras and cellular phones are rapidly increased in these days, and development of electric vehicles, energy storage batteries, robots, satellites, etc. is under active progress, numerous studies are being made on high-performance secondary batteries capable of being repeatedly charged and discharged.

Currently, nickel-cadmium batteries, nickel-hydrogen batteries, nickel-zinc batteries, lithium secondary batteries or the like are commercially available as secondary batteries. Among them, lithium secondary batteries are the center of interest because they hardly have memory effects and can be freely charged or discharged when compared with nickel-based secondary batteries. Advantageously, lithium secondary batteries also exhibit very low self-discharge and high energy density.

In a battery pack including such secondary batteries, a power supply system generally has a current sensor for measuring electric current. The current sensor monitors the state of a battery pack by measuring electric current flowing in the battery pack, and senses over-current that may flow in the battery pack. If the current sensor is beyond normal operation due to malfunction or the like, it is impossible to exactly measure electric current flowing in the battery pack. As a result, when abnormality occurs such as over-current or the like, if it is not properly handled, severe problems may take place, for example, explosion of the battery pack and so on.

To solve the problems, some conventional current sensors are provided with a detection function for detecting whether or not abnormality exists in the current sensors, however this function does not guarantee a perfect operation but has the likelihood of malfunction. Unlike a voltage sensor, a current sensor is applied by various measurement and output methods, and for this reason, it needs to develop corresponding software modules depending on types of current sensors so as to properly realize a function for detecting abnormality of a current sensor. However, it disadvantageously takes much development costs and time.

SUMMARY OF THE INVENTION

The present invention is designed to solve the problems of the prior art, and therefore, it is an object of the present invention to provide a method and an apparatus for detecting abnormality of a current sensor in which abnormality of the current sensor can be indirectly determined by measuring current and voltage of a battery pack.

These and other objects and advantages will be apparent from the embodiments of the present invention. And, the objects and advantages of the invention may be realized by means of instrumentalities and combinations particularly pointed out in the appended claims.

In order to achieve the above object, the present invention provides a method for detecting abnormality of a current sensor operative to measure a charge or discharge current of a battery pack, the method comprising measuring current and voltage of the battery pack; and detecting abnormality of the current sensor by comparing variations in current and voltage over a predetermined time with a current reference value and a voltage reference value, respectively.

Preferably, in case the voltage variation is equal to or smaller than the voltage reference value and the current variation is larger than the current reference value, it is determined that abnormality exists in the current sensor.

Preferably, in case the current variation is equal to or smaller than the current reference value and the voltage variation is larger than the voltage reference value, it is determined that abnormality exists in the current sensor.

Preferably, at least one of the current reference value and the voltage reference value is 0.

Preferably, the current and voltage measuring step is performed periodically and/or by request.

And, in order to achieve the above object, the present invention provides an apparatus for detecting abnormality of a current sensor operative to measure a charge or discharge current of a battery pack, the apparatus comprising a voltage sensor for measuring voltage on both ends of the battery pack; and a controller for detecting abnormality of the current sensor by receiving the measured current and voltage values from the current sensor and the voltage sensor, respectively, and comparing variations in current and voltage over a predetermined time with a current reference value and a voltage reference value, respectively.

Preferably, in case the voltage variation is equal to or smaller than the voltage reference value and the current variation is larger than the current reference value, the controller determines that abnormality exists in the current sensor.

Preferably, in case the current variation is equal to or smaller than the current reference value and the voltage variation is larger than the voltage reference value, the controller determines that abnormality exists in the current sensor.

Preferably, at least one of the current reference value and the voltage reference value is 0.

Preferably, the apparatus further comprises a memory for storing the current reference value and the voltage reference value therein.

Preferably, the current sensor and the voltage sensor measure current and voltage, respectively, periodically and/or by request.

Also, in order to achieve the above object, the present invention provides a battery control system comprising the above-mentioned apparatus for detecting abnormality of a current sensor.

Furthermore, in order to achieve the above object, the present invention provides a battery pack comprising the above-mentioned apparatus for detecting abnormality of a current sensor.

Moreover, in order to achieve the above object, the present invention provides a vehicle comprising the above-mentioned apparatus for detecting abnormality of a current sensor.

EFFECTS OF THE PRESENT INVENTION

According to the present invention, abnormality of a current sensor can be readily detected by measuring voltage and current of a battery pack. And, measuring voltage and current of the battery pack eliminates reliance on types of current sensors in aspect of implementation of a detection algorithm. Furthermore, even when a detection function of a current sensor operates abnormally, it is possible to detect abnormality of the current sensor. Therefore, it is capable of improving reliability of the battery pack, and in case that the current sensor is out of order, of protecting the battery pack from dangerous accidents such as explosion.

BRIEF DESCRIPTION OF THE DRAWINGS

The accompanying drawings illustrate the preferred embodiments of the present invention and are included to provide a further understanding of the spirit of the present invention together with the detailed description of the invention, and accordingly, the present invention should not be limitedly interpreted to the matters shown in the drawings.

DESCRIPTION OF THE PREFERRED EMBODIMENT

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
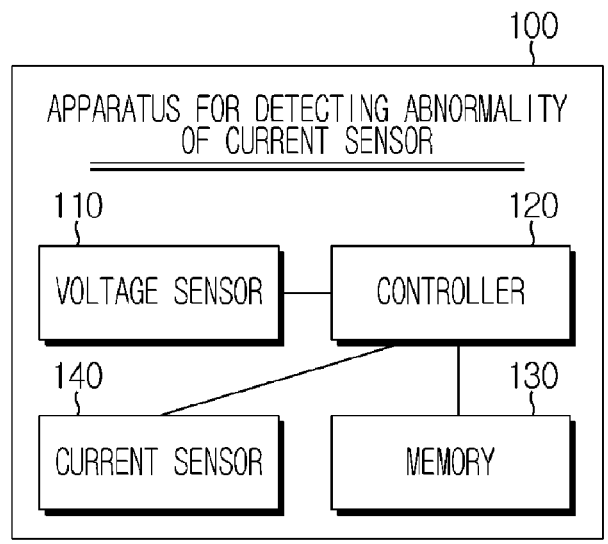
FIG. 1 is a schematic block diagram illustrating a functional configuration of an apparatus for detecting abnormality of a current sensor according to a preferred embodiment of the present invention.

FIG. 1 is a schematic block diagram illustrating a functional configuration of an apparatus 100 for detecting abnormality of a current sensor according to a preferred embodiment of the present invention.

Referring to FIG. 1, the apparatus 100 for detecting abnormality of a current sensor according to the present invention comprises a voltage sensor 110 and a controller 120.

The voltage sensor 110 periodically measures voltage on both ends of a battery pack and outputs the measured voltage to the controller 120. Preferably, the voltage sensor 110 periodically measures voltage on both ends of a battery. Alternatively, the voltage sensor 110 may measure voltage on both ends of a battery as per a user's request. And, a current sensor 140 to be described later may measure current flowing in the battery pack periodically or by request.

The controller 120 receives voltage and current values from the voltage sensor 110 and a current sensor 140 to be described later, respectively, during a predetermined time, and compares variations in voltage and current over the predetermined time with a voltage reference value and a current reference value, respectively, to determine if abnormality exists in the current sensor 140.

Preferably, in case that a voltage variation is equal to or smaller than a voltage reference value and a current variation is larger than a current reference value, the controller 120 determines that abnormality exists in the current sensor 140. And, in case that a current variation is equal to or smaller than a current reference value and a voltage variation is larger than a voltage reference value, the controller 120 determines that abnormality exists in the current sensor 140.

Preferably, the apparatus 100 according to the present invention further comprises a memory 130 for storing a voltage reference value and a current reference value in advance, and for storing an algorithm used to determine whether or not abnormality exists in the current sensor 140. The algorithm is executed by the controller 120 when the apparatus 100 is initiated. Besides, the memory 130 may store various information used to carry out the functions of the voltage sensor 110 and the controller 120.

Figure 2:
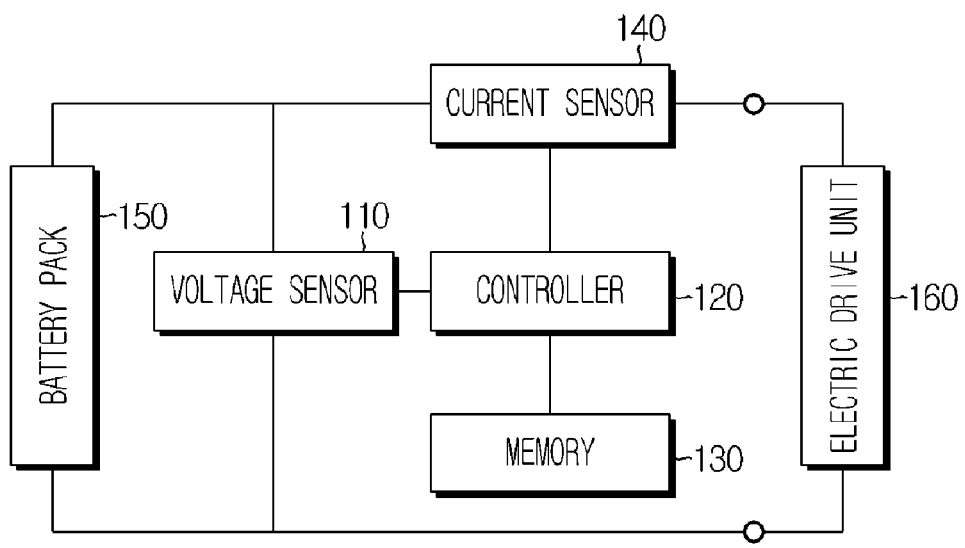
FIG. 2 is a schematic block diagram illustrating a power supply system for an electric drive vehicle, with the apparatus according to an embodiment of the present invention.

FIG. 2 is a schematic block diagram illustrating a power supply system for an electric drive vehicle, with the apparatus 100 according to an embodiment of the present invention.

Referring to FIG. 2, the apparatus 100 according to the present invention is connected to a battery pack 150, an electric drive unit 160 and the current sensor 140, and comprises the voltage sensor 110, the controller 120 and the memory 130.

The battery pack 150 is a high-voltage battery pack for an electric drive vehicle, and corresponds to a power source that provides electric power to the electric drive unit 160. The electric drive unit 160 may be various electric loads in vehicles running on electrical power supplied from the battery pack 150, or generators which charge the battery pack 150. For example, the electric drive unit 160 is a driving motor or an alternator.

The controller 120 determines if abnormality exists in the current sensor 140, by comparing variations in current and voltage over a predetermined time that are periodically measured by the current sensor 140 and the voltage sensor 110, with a current reference value and a voltage reference value, respectively.

In case that a voltage variation is equal to or smaller than a voltage reference value and a current variation is larger than a current reference value, the controller 120 determines that abnormality exists in the current sensor 140. And, in case that a current variation is equal to or smaller than a current reference value and a voltage variation is larger than a voltage reference value, the controller 120 determines that abnormality exists in the current sensor 140.

Meanwhile, a battery control system according to the present invention may comprise the above-mentioned apparatus 100. Here, the battery control system generally controls a charging/discharging operation of the battery pack 150, and may be a battery management system (BMS). Thus, the voltage sensor 110, the controller 120, the memory 130 and the current sensor 140 may be included in the battery control system. However, the present invention is not limited in this regard, and the apparatus 100 may be separate from the battery control system. And, the apparatus 100 may be separately provided outside of the battery pack 150.

And, the battery pack 150 according to the present invention may comprise the above-mentioned apparatus 100. Although FIG. 2 shows each component of the apparatus 100 is provided separately from the battery pack 150, the components of the apparatus 100 may be included in the battery pack 150. In this instance, the battery pack 150 may further comprise a battery cell assembly including at least one battery cell, and a housing for receiving the battery cell assembly and the apparatus 100 therein.

Furthermore, a vehicle according to the present invention may comprise the above-mentioned apparatus 100.

Hereinafter, a method for detecting abnormality of a current sensor using voltage and current variations of a battery pack according to the present invention is described in detail with reference to FIGS. 3 through 6.

Figure 3:
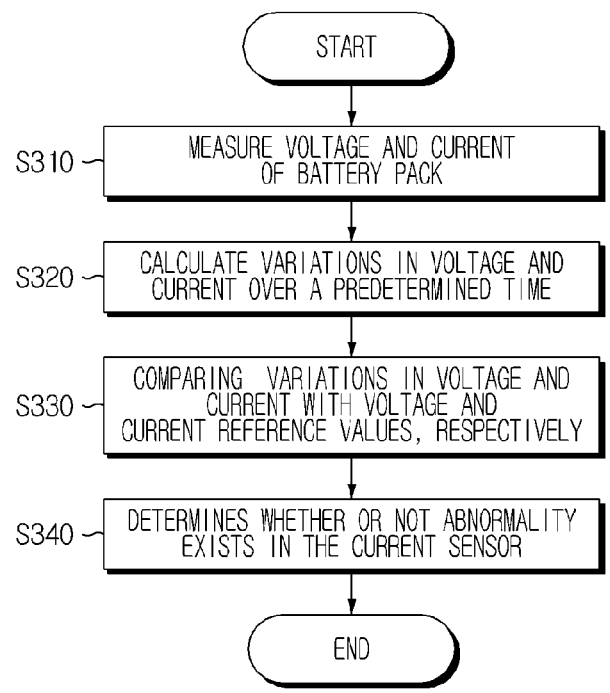
FIG. 3 is a flowchart illustrating a method for detecting abnormality of a current sensor according to an embodiment of the present invention.

FIG. 3 is a flowchart illustrating a method for detecting abnormality of a current sensor according to an embodiment of the present invention.

Referring to FIGS. 2 and 3, first, the controller 120 controls the voltage sensor 110 and the current sensor 140 to measure voltage and current of the battery pack 150 (S310), and calculates variations in voltage and current over a predetermined time on the basis of the measured results. At this time, the step S310 may be performed periodically and/or by request. Next, the controller 120 compares the calculated voltage and current variations with a voltage reference value and a current reference value stored in the memory 130, respectively (S330), and determines if abnormality exists in the current sensor 140 on the basis of the comparison results. Here, the steps S310 through S340 may be performed by a battery control system in a battery pack.

Figure 4:
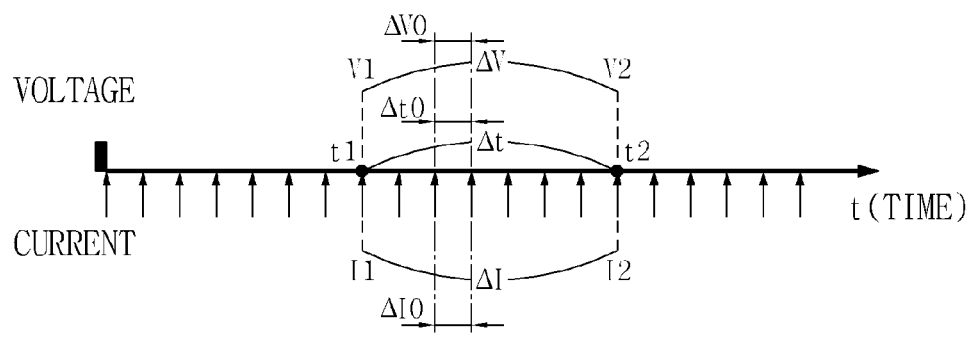
FIG. 4 is a view illustrating periodical voltage and current measurement and variations in voltage and current over a predetermined time according to a preferred embodiment of the present invention.

FIG. 4 is a view illustrating periodical voltage and current measurement and variations in voltage and current over a predetermined time according to a preferred embodiment of the present invention. In FIG. 4, an arrow indicates a point of time when voltage and current is periodically measured, and a time interval of measurement, i.e. a unit time is represented as $\Delta t0$, and variations in voltage and current during the unit time ($\Delta t0$) are represented as $\Delta V0$ and $\Delta I0$, respectively. I1 and V1, and I2 and V2 are current and voltage values measured at a time, t1 and t2, respectively, and a time interval ($\Delta t$) between t1 and t2 is a predetermined time over which voltage and current variations are calculated.

Referring to FIG. 4, in case that a voltage variation ($\Delta V$) over a predetermined time ($\Delta t$) is equal to or smaller than a voltage reference value and a current variation ($\Delta I$) over a predetermined time ($\Delta t$) is larger than a current reference value, it is determined that abnormality exists in a current sensor. And, in case that a current variation ($\Delta I$) over a predetermined time ($\Delta t$) is equal to or smaller than a current reference value and a voltage variation ($\Delta V$) over a predetermined time ($\Delta t$) is larger than a voltage reference value, it is determined that abnormality exists in a current sensor. Here, a voltage variation ($\Delta V$) and a current variation ($\Delta I$) are absolute values according to changes in voltage and current values, and they are equal to or larger than 0.

We will represent it as a formula where a voltage reference value is 'a' and a current reference value is 'b', if the formula satisfies $\Delta V=|V2-V1|\leq a$ and $\Delta I=|I2-I1|>b$, or it satisfies $\Delta I=|I2-I1|\leq b$ and $\Delta V=|V2-V1|>a$, it may be determined that abnormality exists in a current sensor.

And, a variation over a unit time ($\Delta t0$) may be further used to determine if abnormality exists in a current sensor. That is, in case that both a voltage variation ($\Delta V0$) over a unit time ($\Delta t0$) and a voltage variation ($\Delta V$) over a predetermine time ($\Delta t$) are equal to or smaller than a voltage reference value and a current variation ($\Delta I$) over a predetermine time ($\Delta t$) is larger than a current reference value, it is determined that abnormality exists in a current sensor. Similarly, in case that both a current variation ($\Delta I0$) over a unit time ($\Delta t0$) and a current variation ($\Delta I$) over a predetermined time ($\Delta t$) are equal to or smaller than a current reference value and a voltage variation ($\Delta V$) over a predetermined time ($\Delta t$) is larger than a voltage reference value, it is determined that abnormality exists in a current sensor.

We will represent it as a formula where a voltage reference value is 'a' and a current reference value is 'b', if the formula satisfies $\Delta V0\leq a$, $\Delta V=|V2-V1|\leq a$ and $\Delta I=|I2-I1|>b$, or it satisfies $\Delta I0\leq b$, $\Delta I=|I2-I1|\leq b$ and $\Delta V=|V2-V1|>a$, it may be determined that abnormality exists in a current sensor.

It is obvious to an ordinary person skilled in the art that length of a unit time ($\Delta t0$) or a predetermined time ($\Delta t$), a voltage reference value (a) or a current reference value (b) may vary depending on usage type of the present invention.

Preferably, at least one of the voltage reference value (a) and the current reference value (b) is 0. In other words, if there is a current variation over a predetermined time but no voltage variation over a predetermined time, or vice versa, it may be determined that abnormality exists in a current sensor.

Figure 5:
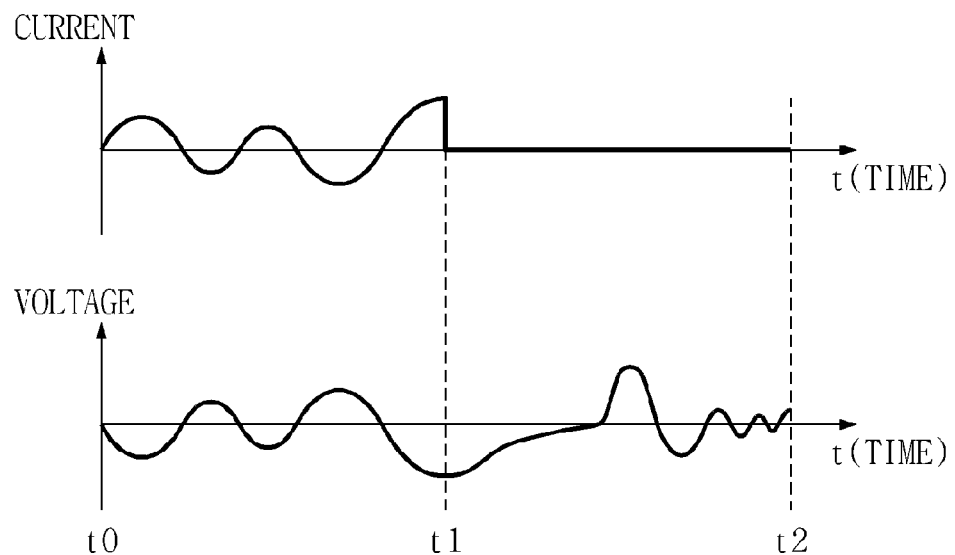
FIG. 5 is a view illustrating a method for detecting abnormality of a current sensor in case a voltage reference value is 0.
Figure 6:
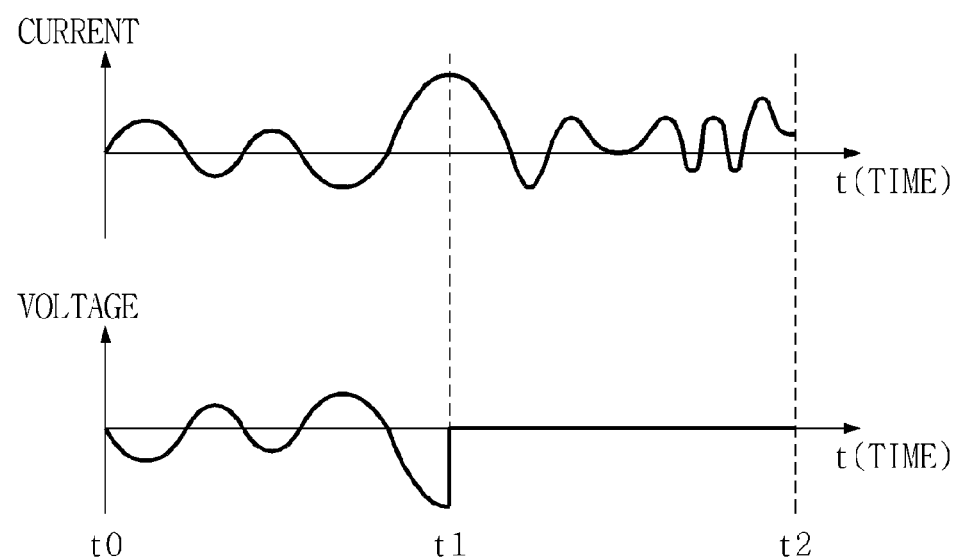
FIG. 6 is a view illustrating a method for detecting abnormality of a current sensor in case a current reference value is 0.

FIG. 5 is a view illustrating a method for detecting abnormality of a current sensor in case a voltage reference value is 0, and FIG. 6 is a view illustrating a method for detecting abnormality of a current sensor in case a current reference value is 0.

Referring to FIG. 5, variations in current and voltage at a section between a time t0 and a time t1 are all larger than a current reference value and a voltage reference value, i.e. 0. In other words, as both current and voltage change at this section, it is determined that a current sensor normally operates. However, at a section between a time t1 and a time t2, current does not change but voltage changes. That is, a current variation is equal to or smaller than a current reference value 0, while a voltage variation is larger than a voltage reference value 0. In this case, it may be thus determined that abnormality exists in a current sensor.

Referring to FIG. 6, at a section between a time t0 and a time t1, it may be determined that a current sensor normally operates, as in FIG. 5. However, at a section between a time t1 and a time t2, voltage does not change but current changes. That is, a voltage variation is equal to or smaller than a voltage reference value 0, while a current variation is larger than a current reference value 0. In this case, it may be thus determined that abnormality exists in a current sensor or a battery pack system.

Meanwhile, it is obvious to an ordinary person skilled in the art that each constituent element described throughout the specification means a logical constituent unit, but does not necessarily mean a physically separable constituent element.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. A method for detecting an abnormality of a current sensor operative to measure a charge or discharge current of a battery pack, the method comprising:

measuring a current of the battery pack using the current sensor; measuring a voltage of the battery pack; and detecting the abnormality of the current sensor by comparing variations in the current and the voltage over a predetermined time with a current reference value and a voltage reference value, respectively, wherein in case the voltage variation is equal to or smaller than the voltage reference value and the current variation is larger than the current reference value, it is determined that the abnormality exists in the current sensor.

2. The method for detecting an abnormality of a current sensor according to claim 1, wherein at least one of the current reference value and the voltage reference value is 0.

3. The method for detecting an abnormality of a current sensor according to claim 1, wherein the current and the voltage measuring step is performed periodically and/or by request.

* * * * *